(12) United States Patent
Wang

(10) Patent No.: US 11,693,512 B2
(45) Date of Patent: Jul. 4, 2023

(54) SIGNAL PROCESSING CIRCUIT AND POSITION DETECTING DEVICE USING THE SAME

(71) Applicant: Shenzhen Huion Animation Technology Co., Ltd., Shenzhen (CN)

(72) Inventor: Zhouhong Wang, Shenzhen (CN)

(73) Assignee: SHENZHEN HUION ANIMATION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/479,027

(22) Filed: Sep. 20, 2021

(65) Prior Publication Data

US 2022/0121315 A1 Apr. 21, 2022

(30) Foreign Application Priority Data

Oct. 21, 2020 (CN) .......................... 202011128334.9

(51) Int. Cl.
| | | |
|---|---|---|
| *G06F 3/041* | (2006.01) | |
| *G06F 3/046* | (2006.01) | |
| *G06F 3/0354* | (2013.01) | |
| *H01Q 1/24* | (2006.01) | |

(52) U.S. Cl.
CPC ........ *G06F 3/0418* (2013.01); *G06F 3/03545* (2013.01); *G06F 3/046* (2013.01); *H01Q 1/24* (2013.01)

(58) Field of Classification Search
CPC .... G06F 3/0418; G06F 3/03545; G06F 3/046; G06F 3/04182; G06F 3/041; H01Q 1/24; H03H 17/0219; H03M 1/1205
See application file for complete search history.

(56) References Cited

U.S. PATENT DOCUMENTS

| | | | |
|---|---|---|---|
| 7,525,050 B1* | 4/2009 | Weaver ................. | G06F 3/0433 702/56 |
| 2003/0217871 A1* | 11/2003 | Chao ....................... | G06F 3/046 178/18.01 |
| 2004/0190085 A1* | 9/2004 | Silverbrook ....... | H04N 1/32778 358/539 |
| 2005/0128191 A1* | 6/2005 | Katsurahira ........... | G06F 3/046 345/179 |
| 2011/0193776 A1* | 8/2011 | Oda ....................... | G06F 3/0446 345/157 |

\* cited by examiner

*Primary Examiner* — Md Saiful A Siddiqui
(74) *Attorney, Agent, or Firm* — IPro, PLLC

(57) ABSTRACT

The present invention provides a signal processing circuit including a control unit, a transmission drive unit, an analog switch array, a signal amplification unit, a detection integration unit that are connected in sequence, and a transceiver antenna connected to the analog switch array. The control unit includes an analog-to-digital converter. The signal processing circuit further includes a level conversion unit arranged between the analog-to-digital converter and the signal amplification unit, the level conversion unit is configured to linearly convert signals received by the transceiver antenna, and transmit the linearly converted signals to the analog-to-digital converter. The signal processing circuit has advantages of low cost, fast handwriting speed, and less cursor wobble. The present invention also provides a position detecting device using the same.

8 Claims, 2 Drawing Sheets

SIGNAL PROCESSING CIRCUIT AND POSITION DETECTING DEVICE USING THE SAME

FIELD OF THE PRESENT DISCLOSURE

The present disclosure relates to the technical field of electromagnetic induction, and in particular, relates to a signal processing circuit and a position detecting device.

DESCRIPTION OF RELATED ART

A system block diagram of a conventional electromagnetic passive handwriting system is illustrated in FIG. 1. A microcontroller unit (MCU) outputs a pulse signal to a transmitter circuit, such that an electromagnetic signal having a specific strength is generated on a tablet, an LC resonant loop in an electromagnetic stylus senses the electromagnetic signal and concentrate energy. When the electromagnetic signal is stopped, the LC resonant loop generates an electromagnetic signal with a progressively attenuated amplitude at an inherited resonance frequency. When a transceiver antenna receives an electromagnetic signal emitted by the electromagnetic stylus, the electromagnetic signal is first amplified by a signal amplification circuit, a high-frequency fundamental signal is removed by detection integration, and an acquired low-frequency envelope signal is transmitted to the MCU for processing. In this way, positioning and pressure sensing are achieved.

This technique is generally applied to a drawing tablet or a pen display subject to less interference. However, when this technique is applied to other liquid crystal modules, due to a high strength of a liquid drive signal, great electromagnetic interference is caused, which causes cursor wobble of the digital screen. To solve this problem, a method of improving the amplitude of the emitted signal or improving a signal-to-noise ratio of the system is typically employed. In this method, a boost circuit needs to be additionally arranged, high voltage-withstanding devices or elements need to be employed for the transmission portion. As a result, the cost of the electromagnetic passive handwriting system is increased. In addition, large-power transmission may increase power consumption of the entire system, which is unfavorable to power energy saving.

Therefore, it is necessary to provide a signal processing circuit and a position detecting device to solve the above problem.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to several exemplary embodiments. To make the technical problems to be solved, technical solutions and beneficial effects of the present disclosure more apparent, the present disclosure is described in further detail together with the figure and the embodiments. It should be understood the specific embodiments described hereby is only to explain the disclosure, not intended to limit the disclosure.

Figure 1:
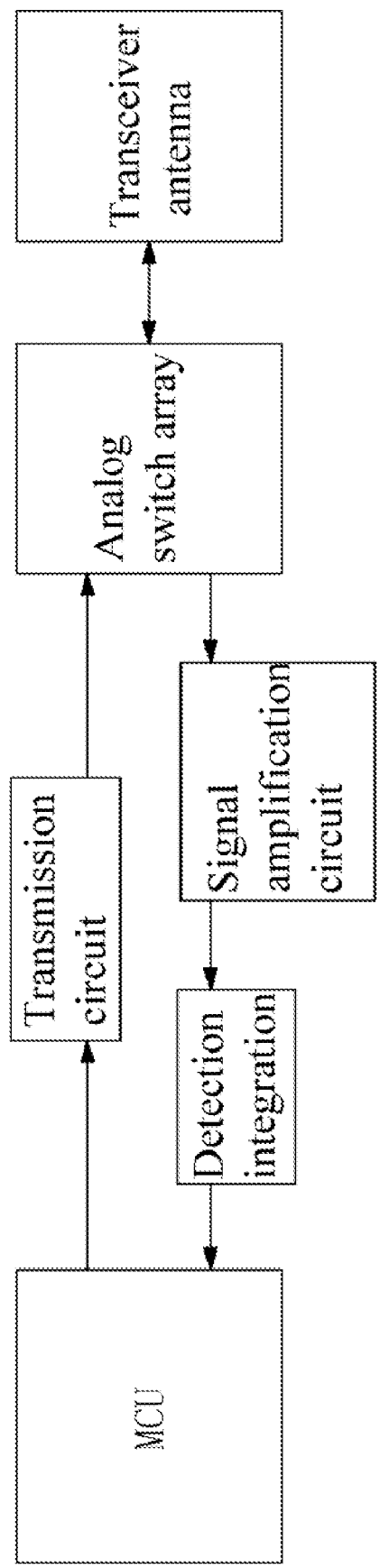
FIG. 1 is a system block diagram of an electromagnetic passive handwriting system according to a related art.
Figure 2:
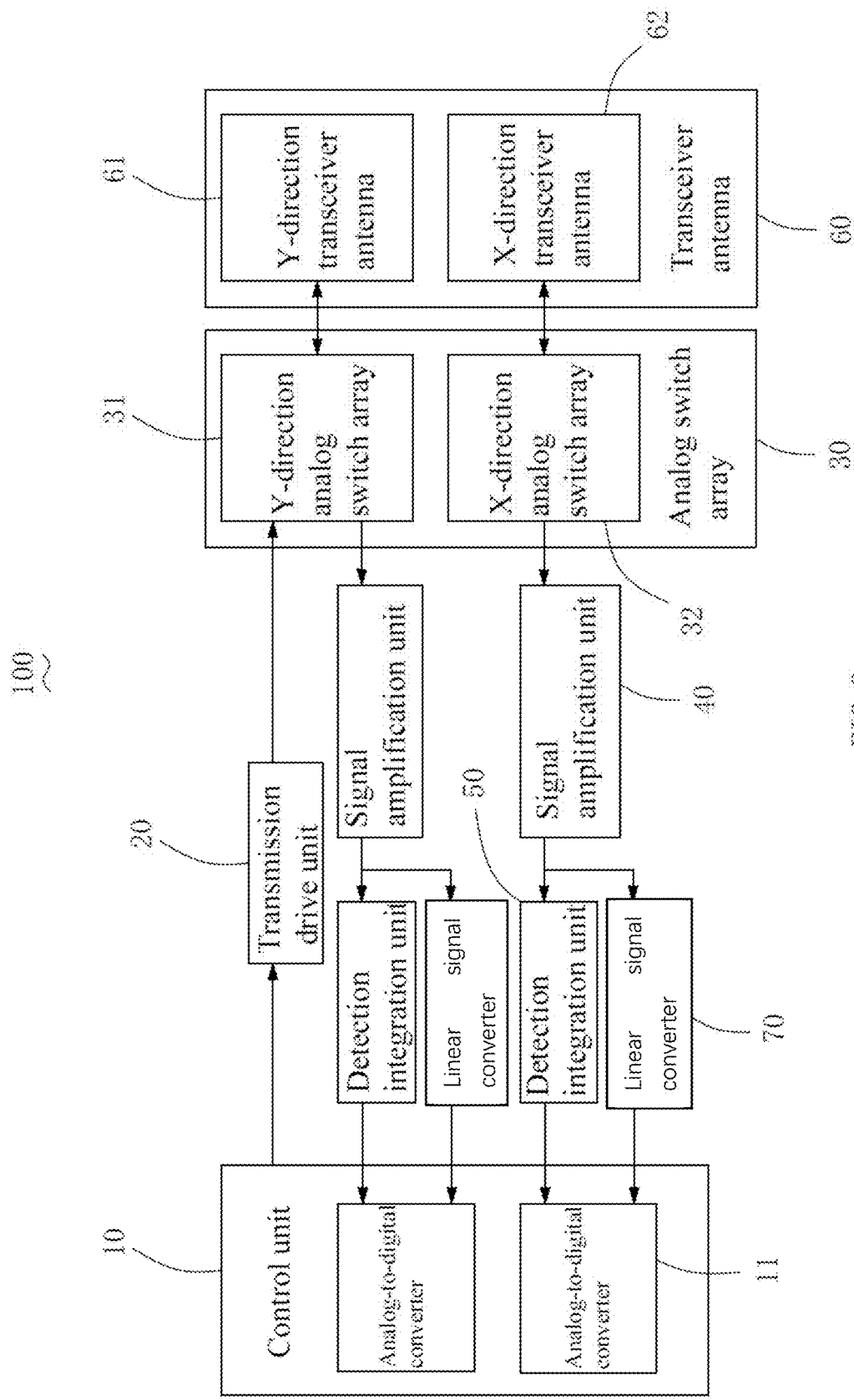
FIG. 2 is a system block diagram of a signal processing circuit according to the present disclosure.

Referring to FIG. 2, a system block diagram of a signal processing circuit according to the present disclosure is illustrated. The present disclosure provides a signal processing circuit 100. The signal processing circuit 100 includes a control unit 10, a transmission drive unit 20, an analog switch array 30, a signal amplification unit 40, a detection integration unit 50 that are connected in sequence, a transceiver antenna 60 connected to the analog switch array 30, and a linear signal converter 70 connected to the control unit 10. In this embodiment, the control unit 10 is a microcontroller unit (MCU).

The transceiver antenna 60 includes a Y-direction transceiver antenna 61 and an X-direction transceiver antenna 62. The analog switch array 30 includes a Y-direction analog switch array 31 connected to the Y-direction transceiver antenna 61 and an X-direction analog switch array 32 connected to the X-direction transceiver antenna 62. The transceiver antenna 60 simultaneously processes vertical and horizontal coordinates by the Y-direction transceiver antenna 61 and the X-direction transceiver antenna 62, which shortens the time for signal reception and processing. In this way, more coordinates and pressure sensitive data are processed within the same time period, a report rate is improved, and a higher handwriting speed is achieved.

The control unit 10 is internally provided with two analog-to-digital converters 11. The analog-to-digital converters 11 are configured to process signals received by the transceiver antenna 60. Specifically, the analog-to-digital converter 11 is connected to the detection integration unit 50 and the linear signal converter 70, and the linear signal converter 70 linearly converts signals received via the Y-direction transceiver antenna 61 and the X-direction transceiver antenna 62.

Each of the analog-to-digital converters 11 at least include two channels. The detection integration unit 50 and the linear signal converter 70 are both connected to the analog-to-digital converters 11, the signals received by the transceiver antenna respectively travel through the detection integration unit 50 and the linear signal converter 70 and are simultaneously transmitted to the analog-to-digital converters 11 respectively over the channels, and the analog-to-digital converters 11 process the signals transmitted by the detection integration unit 50 or the linear signal converter 70. Specifically, the analog-to-digital converters 11 process handwriting signals by a digital bandpass filter, and restore the handwriting signals to ideal electromagnetic handwriting signals by a waveform fitting algorithm, thereby eliminating interference caused by timing signals on the pen display. Particularly, the waveform fitting algorithm includes a least-square curve fitting algorithm or a sine curve fitting algorithm, and the digital bandpass filter includes an FIR bandpass filter or a Butterworth filter. In the present disclosure, to accommodate the high-speed operation on the digital signals, the control unit 10 has a clock frequency not less than 150 MHz. In this case, the analog-to-digital converters 11 have a sampling frequency not less than 5 MSPS (Million Samples per Second).

The operating principle of the signal processing circuit 100 is as follows:

The transceiver antenna 60 transmits an X-fundamental-frequency signal and a Y-fundamental-frequency signal that are processed by the signal amplification unit 40 to the analog-to-digital converters 11 respectively via the Y-direction transceiver antenna 61 and the X-direction transceiver antenna 62, and the analog-to-digital converters 11 convert the signals into digital signals. The handwriting signals, after being processed by the signal amplification unit 40, may be linearly converted by the detection integration unit 50 and the linear signal converter 70. the interference signals are eliminated, the ideal electromagnetic handwriting signals are restored, and coordinate values and pressure sensitive values thereof are acquired. The linear signal converter converts the voltage signal linearly by means of a resistor or transformer, etc.

The present disclosure further provides a position detecting device. The position detecting device includes the signal processing circuit as described above.

As compared with the related art, the signal processing circuit and the position detecting device according to the present disclosure achieve the following beneficial effects:

(1) Digital processing is employed, software programming is flexible, data processing is quick, digital bandpass filter performance is good, and anti-interference is enhanced.

(2) The signal processing circuit is simple, and low voltage-withstanding elements or devices are employed, such that the cost is lowered.

(3) The horizontal and vertical coordinates are simultaneously processed, signal processing time is shortened, such that within the same time period, more coordinates and pressure sensitive data are reported, the report rate is improved. Thus, a higher handwriting speed is achieved, and cursor wobble is mitigated.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. Signal processing circuit, comprising a control unit, a transmission drive unit, an analog switch array, a signal amplification unit, a detection integration unit that are connected in sequence, and a transceiver antenna connected to the analog switch array; wherein the control unit comprises an analog-to-digital converter, and each of the analog-to-digital converters at least comprises two channels; the signal processing circuit further comprising a linear signal converter arranged between the analog-to-digital converter and the signal amplification unit, wherein the linear signal converter is configured to linearly convert signals received by the transceiver antenna, and transmit the linearly converted signals to the analog-to-digital converter; and wherein the detection integration unit and the linear signal converter are both connected to the analog-to-digital converters, the signals received by the transceiver antenna respectively travel through the detection integration unit and the linear signal converter and are simultaneously transmitted to the analog-to-digital converters respectively over the channels, and the analog-to-digital converters process the signals transmitted by the detection integration unit or the linear signal converter.

2. He signal processing circuit according to claim 1, wherein the transceiver antenna comprises a Y-direction transceiver antenna and an X-direction transceiver antenna, the analog switch array comprises a Y-direction analog switch array connected to the Y-direction transceiver antenna, and an X-direction analog switch array connected to the X-direction transceiver antenna, the control unit further comprises another analog-to-digital converter, The two analog-to-digital converters are configured to respectively process signals received by the transceiver antenna.

3. The signal processing circuit according to claim 1, wherein the analog-to-digital converters process the signals by using a waveform fitting algorithm upon processing the signals by using a digital bandpass filter.

4. The signal processing circuit according to claim 3, wherein the signal bandpass filter comprises an Finite Impulse Response bandpass filter or a Butterworth filter.

5. The signal processing circuit according to claim 3, wherein the waveform fitting algorithm comprises a least-square curve fitting algorithm or a sine curve fitting algorithm.

6. The signal processing circuit according to claim 1, wherein the control unit has a clock frequency not less than 150 MHz.

7. The signal processing circuit according to claim 1, wherein the analog-to-digital converters have a sampling frequency not less than 5 Million Samples per Second.

8. A positioning detecting device, comprising a signal processing circuit, wherein the signal processing circuit comprises a control unit, a transmission drive unit, an analog switch array, a signal amplification unit, a detection integration unit that are connected in sequence, and a transceiver antenna connected to the analog switch array; the control unit comprises an analog-to-digital converter, and each of the analog-to-digital converters at least comprises two channels; the signal processing circuit further comprises a linear signal converter arranged between the analog-to-digital converter and the signal amplification unit, the linear signal converter is configured to linearly convert signals received by the transceiver antenna, and transmit the linearly converted signals to the analog-to-digital converter; and the detection integration unit and the linear signal converter are both connected to the analog-to-digital converters, the signals received by the transceiver antenna respectively travel through the detection integration unit and the linear signal converter and are simultaneously transmitted to the analog-to-digital converters respectively over the channels, and the analog-to-digital converters process the signals transmitted by the detection integration unit or the linear signal converter.

\* \* \* \* \*